(12) United States Patent
Kaneko et al.

(10) Patent No.: US 10,043,652 B2
(45) Date of Patent: Aug. 7, 2018

(54) SUBSTRATE CLEANING METHOD, SUBSTRATE CLEANING SYSTEM, AND MEMORY MEDIUM

(71) Applicant: TOKYO ELECTRON LIMITED, Minato-ku (JP)

(72) Inventors: Miyako Kaneko, Nirasaki (JP); Keiji Tanouchi, Nirasaki (JP); Takehiko Orii, Nirasaki (JP); Itaru Kanno, Minato-ku (JP)

(73) Assignee: TOKYO ELECTRON LIMITED, Minato-ku, Tokyo ( * ) Notice: Subject to any disclaimer, the term of this patent is extended or adjusted under 35 U.S.C. 154(b) by 134 days.

(21) Appl. No.: 14/539,206

(22) Filed: Nov. 12, 2014

(65) Prior Publication Data
US 2015/0128995 A1  May 14, 2015

(30) Foreign Application Priority Data
Nov. 13, 2013 (JP) .................................. 2013-234897

(51) Int. Cl.
| | | |
|---|---|---|
| *B08B 3/00* | (2006.01) | |
| *H01L 21/02* | (2006.01) | |
| *B08B 7/00* | (2006.01) | |
| *C11D 11/00* | (2006.01) | |
| *H01L 21/67* | (2006.01) | |

(52) U.S. Cl.
CPC ...... *H01L 21/02041* (2013.01); *B08B 7/0014* (2013.01); *C11D 11/0047* (2013.01); *H01L 21/67051* (2013.01)

(58) Field of Classification Search
None
See application file for complete search history.

(56) References Cited

U.S. PATENT DOCUMENTS

| 7,267,130 B2 | 9/2007 | Okuda et al. |
| 8,023,099 B2 | 9/2011 | Yamamoto |
| 2010/0104953 A1* | 4/2010 | Papanu ................... G03F 7/427 430/5 |
| 2011/0308549 A1* | 12/2011 | Minami ............ H01L 21/02052 134/18 |
| 2013/0125931 A1 | 5/2013 | Nagamine et al. |
| 2014/0041685 A1 | 2/2014 | Kaneko et al. |

(Continued)

FOREIGN PATENT DOCUMENTS

| JP | 08-318181 A | 12/1996 |
| JP | 2000-156362 A | 6/2000 |

(Continued)

*Primary Examiner* — Mikhail Kornakov
*Assistant Examiner* — Ryan L. Coleman
(74) *Attorney, Agent, or Firm* — Oblon, McClelland, Maier & Neustadt, L.L.P.

(57) ABSTRACT

A method for cleaning a substrate, includes supplying to a substrate having a hydrophilic surface a film-forming processing liquid which includes a volatile component and forms a film on the substrate, vaporizing the volatile component in the film-forming processing liquid such that the film-forming processing liquid solidifies or cures on the substrate and forms a processing film on the hydrophilic surface of the substrate, and supplying to the substrate having the processing film a strip-processing liquid for stripping the processing film from the substrate.

15 Claims, 12 Drawing Sheets

(56) References Cited

U.S. PATENT DOCUMENTS

2014/0144464 A1   5/2014   Kaneko et al.
2014/0144465 A1   5/2014   Kaneko et al.

FOREIGN PATENT DOCUMENTS

| JP | 2007-258462 A | 10/2007 |
| JP | 2008-060368 A | 3/2008 |
| JP | 2010-010242 A | 1/2010 |
| JP | 2010-027786 A | 2/2010 |
| JP | 2012-174775 A | 9/2012 |
| TW | 200738358 A | 10/2007 |
| TW | 200802575 A | 1/2008 |
| TW | 201335988 A | 9/2013 |

* cited by examiner

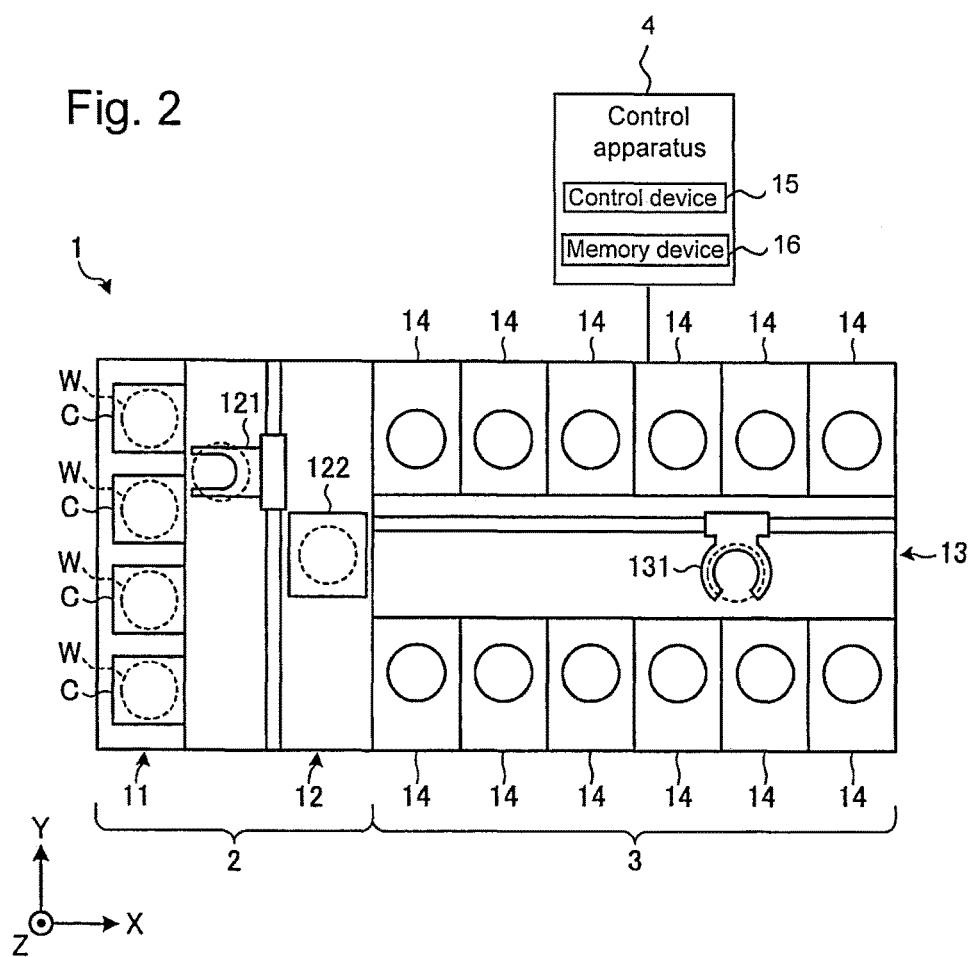

SUBSTRATE CLEANING METHOD, SUBSTRATE CLEANING SYSTEM, AND MEMORY MEDIUM

CROSS-REFERENCE TO RELATED APPLICATIONS

The present application is based upon and claims the benefit of priority to Japanese Patent Application No. 2013-234897, filed Nov. 13, 2013, the entire contents of which are incorporated herein by reference.

BACKGROUND OF THE INVENTION

Field of the Invention

The embodiments disclosed herein relate to a substrate cleaning method, substrate cleaning system and memory medium.

Description of Background Art

There is a substrate cleaning apparatus which removes particles attached to substrates such as silicon wafers and compound semiconductor wafers by using physical force generated when a fluid such as liquid or gas is supplied onto substrate surfaces (see JP H08-318181A). Also, there is another cleaning apparatus which removes particles by supplying a chemical solution such as SC1 to substrate surfaces so as to use chemical reactions (such as etching) of the supplied solution (see JP2007-258462A). The entire contents of these publications are incorporated herein by reference.

SUMMARY OF THE INVENTION

According to an aspect of the present invention, a method for cleaning a substrate, includes supplying to a substrate having a hydrophilic surface a film-forming processing liquid which includes a volatile component and forms a film on the substrate, vaporizing the volatile component in the film-forming processing liquid such that the film-forming processing liquid solidifies or cures on the substrate and forms a processing film on the hydrophilic surface of the substrate, and supplying to the substrate having the processing film a strip-processing liquid for stripping the processing film from the substrate.

According to another aspect of the present invention, an apparatus for cleaning a substrate includes a chamber which accommodates e a substrate, a substrate holding device which holds the substrate in the chamber, a film-forming processing liquid supply device which supplies a film-forming processing liquid which includes a volatile component and forms a film on the substrate such that the film-forming processing liquid is supplied to the hydrophilic surface of the substrate accommodated in the chamber, and a stripping-processing liquid supply device which supplies a stripping-processing liquid which strips a processing film formed by solidifying or curing the film-forming processing liquid through vaporization of the volatile component in the film-forming processing liquid such that the stripping-processing liquid is supplied to the processing film formed on the substrate accommodated in the chamber.

According to yet another aspect of the present invention, a substrate cleaning system includes a loading/unloading station including a carrier mounting device and a transfer device, a processing station connected to the loading/unloading station and including a transfer device and multiple substrate cleaning apparatuses, and a control apparatus which controls the loading/unloading station and the processing station. Each of the substrate cleaning apparatuses in the processing station includes a chamber which accommodates a substrate, a substrate holding device which holds the substrate in the chamber, a film-forming processing liquid supply device which supplies a film-forming processing liquid which includes a volatile component and forms a film on the substrate such that the film-forming processing liquid is supplied to the hydrophilic surface of the substrate accommodated in the chamber, and a stripping-processing liquid supply device which supplies a stripping-processing liquid which strips a processing film formed by solidifying or curing the film-forming processing liquid through vaporization of the volatile component in the film-forming processing liquid such that the stripping-processing liquid is supplied to the processing film formed on the substrate accommodated in the chamber.

BRIEF DESCRIPTION OF THE DRAWINGS

A more complete appreciation of the invention and many of the attendant advantages thereof will be readily obtained as the same become better understood by reference to the following detailed description when considered in connection with the accompanying drawings, wherein:

FIG. 2 is a view schematically showing the structure of a substrate cleaning system according to the first embodiment;

DETAILED DESCRIPTION OF THE EMBODIMENTS

Figure 1A:
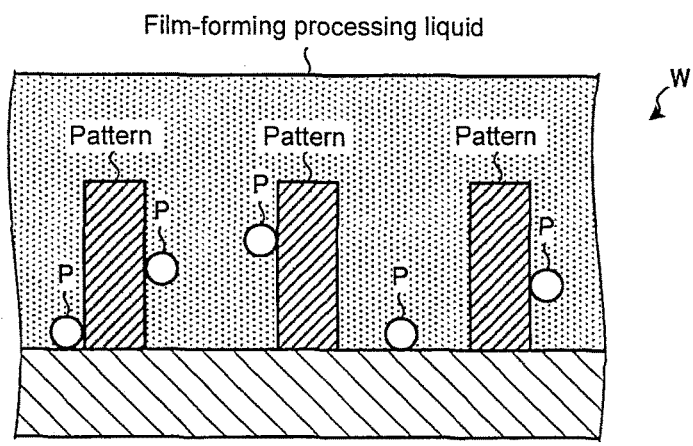
FIG. 1A is a view to illustrate a substrate cleaning method according to a first embodiment.

The embodiments will now be described with reference to the accompanying drawings, wherein like reference numerals designate corresponding or identical elements throughout the various drawings.

First Embodiment

Details of Substrate Cleaning Method

A substrate cleaning method according to a first embodiment is described in detail by referring to FIG. 1A~1E. FIG. 1A~1E are views to illustrate a substrate cleaning method of the first embodiment.

In the substrate cleaning method of the first embodiment, a processing liquid that contains a volatile component and forms a film on a wafer (W) (hereinafter referred to as a "film-forming liquid") is supplied to the patterned surface of a substrate such as a silicon wafer or a compound semiconductor wafer (hereinafter referred to as a "wafer (W)"), as shown in FIG. 1A.

The patterned surface of a wafer (W) is made hydrophilic by, for example, coating a hydrophilic film (not shown) or by applying hydrophilization treatment using ozone water or the like.

The film-forming liquid supplied to the patterned surface of a wafer (W) solidifies or cures while undergoing volume contraction caused by vaporization of the volatile component so that a processing film is formed. Accordingly, patterns formed on the wafer (W) and particles (P) attached to the patterns are covered by the processing film (see FIG. 1B). Here, "to solidify" means a liquid becomes a solid state, and "to cure" means molecules are bonded to each other and become a polymer (such as crosslinking, polymerization or the like).

Figure 1B:
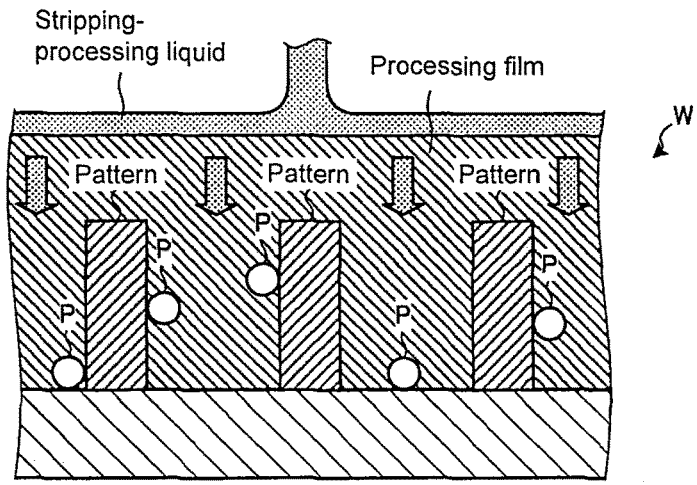
FIG. 1B is a view to illustrate a substrate cleaning method according to the first embodiment.

As shown in FIG. 1B, a stripping-processing liquid is supplied to the processing film on the wafer (W). A stripping-processing liquid is used to strip the processing film from the wafer (W).

In particular, a stripping-processing liquid is a hydrophilic treatment liquid, and when it is supplied on the processing film, it infiltrates the processing film and reaches the interface of a wafer (W). Since the interface of a wafer (W) where patterns are formed is hydrophilic, the stripping-processing liquid that has reached the interface of the wafer (W) infiltrates the patterned surface on the interface of the wafer (W).

Figure 1C:
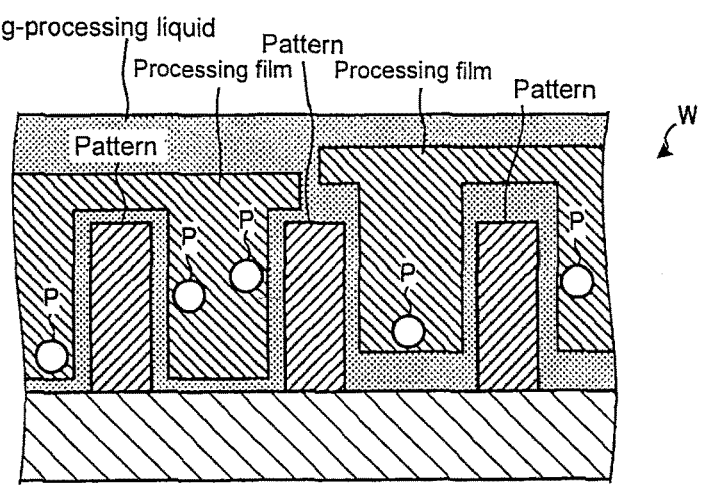
FIG. 1C is a view to illustrate a substrate cleaning method according to the first embodiment.
Figure 1D:
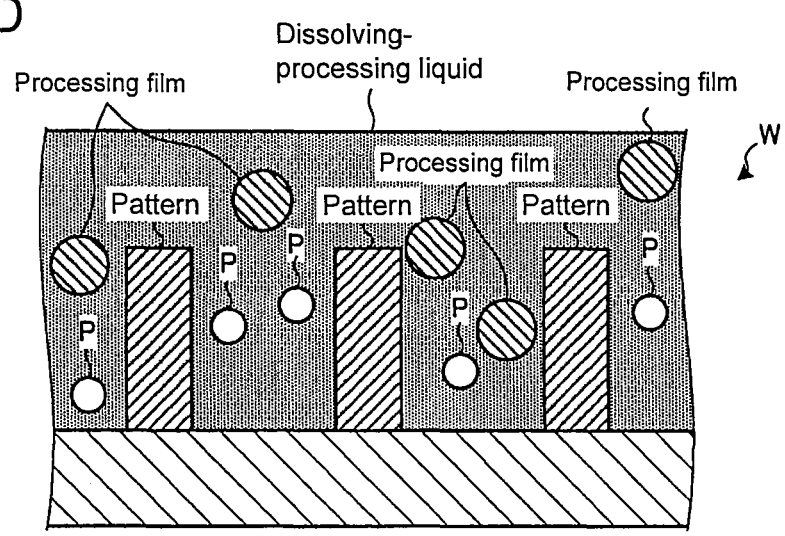
FIG. 1D is a view to illustrate a substrate cleaning method according to the first embodiment.
Figure 1E:
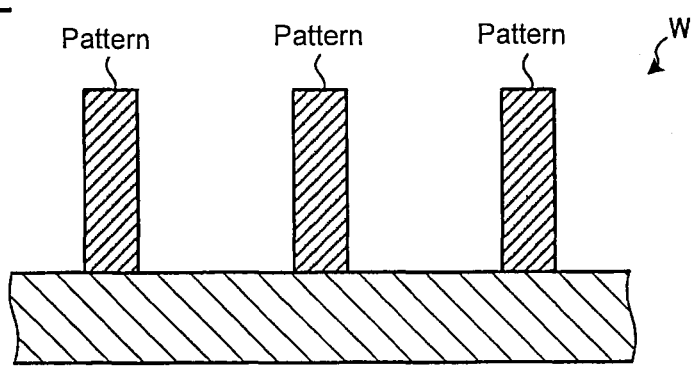
FIG. 1E is a view to illustrate a substrate cleaning method according to the first embodiment.

When the stripping-processing liquid infiltrates between the wafer (W) and the processing film, the processing film is stripped from the wafer (W) in a state of "film." Accordingly, particles (P) attached to the patterned surface are also stripped from the wafer (W) along with the processing film (see FIG. 1C).

Particles (P) attached to the patterns or the like are stripped from the patterns by a film-forming liquid through strain (tensile force) caused by volume contraction that occurs when the volatile component is vaporized.

A dissolving-processing liquid capable of dissolving a processing film is supplied to the processing film stripped from the wafer (W). Accordingly, the processing film dissolves and particles (P) captured by the processing film float in the dissolving-processing liquid (see FIG. 1D). Then, particles (P) are removed from the wafer (W) when the dissolving-processing liquid and the dissolved processing film are rinsed off by pure water or the like (see FIG. 1E).

In the substrate cleaning method according to the first embodiment, the processing film formed on a wafer (W) is stripped from the wafer (W) in a state of "film" so that particles (P) attached to the patterns or the like are removed from the wafer (W) along with the processing film.

According to the substrate cleaning method of the first embodiment, since particles are removed without using chemical reactions, erosion of the base layer caused by etching or the like is suppressed.

According to the substrate cleaning method of the first embodiment, since particles (P) are removed using weaker force compared with a substrate cleaning method that uses physical force, collapse of patterns is also suppressed.

Using the substrate cleaning method of the first embodiment, removal of particles (P) is facilitated for those having a smaller particle diameter which are difficult to remove by a substrate cleaning method that uses physical force. Such an effect is described later using the comparison results of particle removal rates between the substrate cleaning method of the first embodiment and a substrate cleaning method using physical force (see FIG. 5).

According to the substrate cleaning method of the first embodiment, a processing film is formed on a wafer (W) and then is completely removed from the wafer (W) without conducting pattern exposure. Thus, after the cleaning processing, the patterned surface of a wafer (W) returns to the state it had before the film-forming liquid was coated, namely, a state where the patterned surface is exposed.

Substrate Cleaning System

The structure of a substrate cleaning system of the first embodiment is described with reference to FIG. 2. FIG. 2 is a view schematically showing the structure of a substrate cleaning system of the first embodiment. In the following, to clarify the positional relationships, axes (X, Y, Z) vertically intersecting each other are defined, where the positive direction of axis (Z) is set in a vertically upward direction.

As shown in FIG. 2, substrate cleaning system 1 has loading/unloading station 2 and processing station 3. Loading/unloading station 2 and processing station 3 are positioned next to each other.

Loading/unloading station 2 includes carrier mounting section 11 and transfer section 12. Multiple transfer containers (hereinafter referred to as a "carrier (C)") capable of horizontally accommodating multiple wafers (W) are positioned in carrier mounting section 11.

Transfer section 12 is positioned adjacent to carrier mounting section 11. Substrate transfer device 121 and delivery device 122 are provided in transfer section 12.

Substrate transfer device 121 has a wafer holding mechanism for holding a wafer (W). Also, substrate transfer device 121 is capable of moving in horizontal and vertical directions as well as rotating around the vertical axis, and transfers a wafer (W) between carrier (C) and delivery device 122 using the wafer holding mechanism.

Processing station 3 is provided next to transfer section 12. Processing station 3 has transfer section 13 and multiple substrate cleaning apparatuses 14. Multiple substrate cleaning apparatuses 14 are arrayed along both sides of transfer section 13.

Substrate transfer device 131 is provided in transfer section 13. Substrate transfer device 131 has a wafer holding mechanism for holding a wafer (W). In addition, substrate transfer device 131 is capable of moving in horizontal and vertical directions as well as rotating around the vertical axis, and transfers a wafer (W) between delivery device 122 and substrate cleaning apparatus 14 using the wafer holding mechanism.

Substrate cleaning apparatus 14 performs a substrate cleaning processing according to the above-described substrate cleaning method. The detailed structure of substrate cleaning apparatus 14 will be described later.

Substrate cleaning system 1 has control apparatus 4. Control apparatus 4 controls operations in substrate cleaning system 1. Control apparatus 4 is a computer, for example, and is equipped with control device 15 and memory device 16. Programs are stored in memory device 16 to control various processings such as a substrate cleaning processing or the like. Control device 15 controls operations conducted in substrate cleaning system 1 by reading out and executing the program stored in memory device 16.

The program may be such that is stored in a memory medium readable by a computer and is installed from the memory medium into memory device 16 of control apparatus 4. Examples of memory media readable by a computer are a hard disc (HD), flexible disc (FD), compact disc (CD), magneto-optical disc (MO), memory card and the like.

In substrate cleaning system 1 structured as above, first, substrate transfer device 121 of loading/unloading station 2 unloads a wafer (W) from carrier (C) and mounts the unloaded wafer (W) on delivery device 122. The wafer (W) mounted on delivery device 122 is unloaded from delivery device 122 by substrate transfer device 131 of processing station 3 and is loaded into substrate cleaning apparatus 14. Then, substrate cleaning processing is performed on the wafer (W) by substrate cleaning apparatus 14. The cleaned wafer (W) is unloaded from substrate cleaning apparatus 14 by substrate transfer device 131, mounted on delivery device 122 and returned to carrier (C) by substrate transfer device 121.

Substrate Cleaning Apparatus

Figure 3:
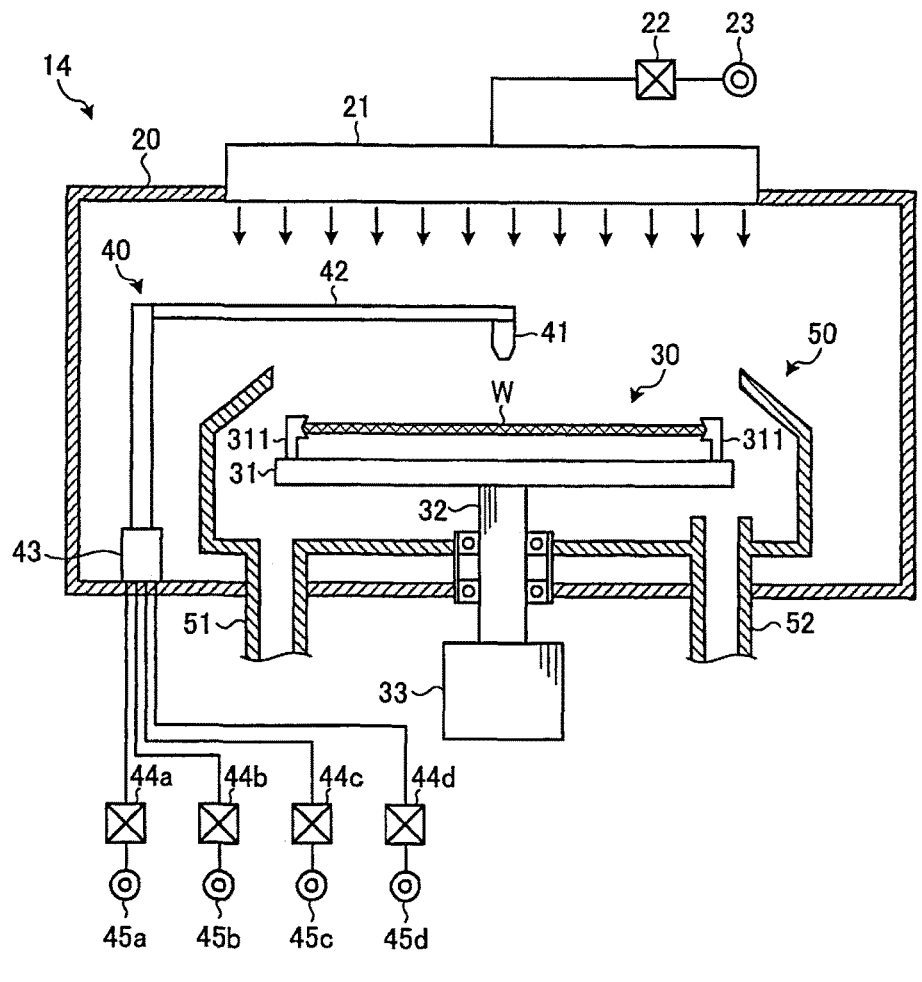
FIG. 3 is a view schematically showing the structure of a substrate cleaning apparatus according to the first embodiment.

The structure of substrate cleaning apparatus 14 is described by referring to FIG. 3. FIG. 3 is a view schematically showing the structure of substrate cleaning apparatus 14 of the first embodiment.

As shown in FIG. 3, substrate cleaning apparatus 14 is equipped with chamber 20, substrate holding mechanism 30, liquid supply device 40 and collection cup 50.

Chamber 20 has substrate holding mechanism 30, liquid supply device 40 and collection cup 50. On the ceiling section of chamber 20, a fan filter unit (FFU) 21 is provided. FFU 21 produces a downflow in chamber 20.

FFU 21 is connected to downflow-gas supply source 23 via valve 22. FFU 21 discharges a downflow gas (such as dry air) supplied from downflow-gas supply source 23 into chamber 20.

Substrate holding mechanism 30 is formed with rotation holding section 31, support column 32 and driver device 33. Rotation holding section 31 is positioned in the approximate center of chamber 20. Holding member 311 is provided on the upper surface of rotation holding section 31 so as to hold the sides of a wafer (W). A wafer (W) is horizontally held by holding member 311 while it is slightly separated from the upper surface of rotation holding section 31.

Support column 32 is a member extending in a vertical direction, and its base portion is supported to be rotatable by driver device 33 and its tip portion horizontally supports rotation holding section 31. Driver device 33 rotates support column 32 around the vertical axis.

Substrate holding mechanism 30 rotates support column 32 by using driver device 33 to rotate rotation holding section 31 supported by support column 32. A wafer (W) held at rotation holding section 31 rotates accordingly.

Liquid supply device 40 supplies various processing liquids to a wafer (W) held by substrate holding mechanism 30. Liquid supply device 40 is equipped with nozzle 41, arm 42 to horizontally support nozzle 41, and rotatable elevator mechanism 43 to rotate, elevate and lower arm 42.

Nozzle 41 is connected to ozone water supply source (45*a*), topcoat liquid supply source (45*b*), DIW supply source (45*c*) and alkali developing solution supply source (45*d*) respectively through valves (44*a*~44*d*). DIW is pure water at normal temperature (approximately 23~25 degrees). In the present embodiment, there is one nozzle 41 provided in the liquid supply device. However, there may be two or more nozzles. For example, four nozzles may be provided to individually supply different types of processing liquids.

Liquid supply device 40 is structured as above, and supplies ozone water, topcoat liquid, DIW or alkali developing solution to a wafer (W).

Ozone water is an example of a hydrophilization treatment liquid to provide hydrophilic properties for the patterned surface of a wafer (W). Instead of ozone water, a hydrogen-peroxide solution may also be used as a hydrophilization treatment liquid. In addition, hydrophilization treatment may be conducted by other methods, for example, coating a hydrophilic film such as top anti-reflective coating (TARC), ashing, UV irradiation, attaching a hydrophilic group to a monomolecular layer or the like.

A topcoat solution is an example of film-forming processing for forming a topcoat film on a wafer (W). A topcoat film is a protective film to be coated on the upper surface of a resist layer so as to prevent an immersion liquid from infiltrating the resist layer. An immersion liquid is used in immersion exposure in a lithographic process, for example.

DIW is an example of a stripping-processing liquid for stripping a topcoat film from a wafer (W). DIW is also used as a rinsing-treatment liquid in a rinsing process conducted after the later-described dissolving-processing liquid supply process.

An alkali developing solution is an example of a dissolving-processing liquid to dissolve a topcoat film. An example of an alkali developing solution is not limited specifically as long as it contains at least one of quaternary ammonium hydroxide solutions such as aqueous ammonium and tetra methyl ammonium hydroxide (TMAH), and choline-based solutions.

Collection cup 50 is positioned to surround rotation holding section 31, and collects processing liquid being scattered from a wafer (W) when rotation holding section 31 rotates. Drain port 51 is formed at the bottom of collection cup 50, and the processing liquid collected by collection cup 50 is drained from drain port 51 to the outside of substrate cleaning apparatus 14. In addition, exhaust port 52 is also formed at the bottom of collection cup 50 to exhaust a downflow gas supplied from FFU 21 to the outside of substrate cleaning apparatus 14.

Procedures for Substrate Cleaning System

Figure 4:
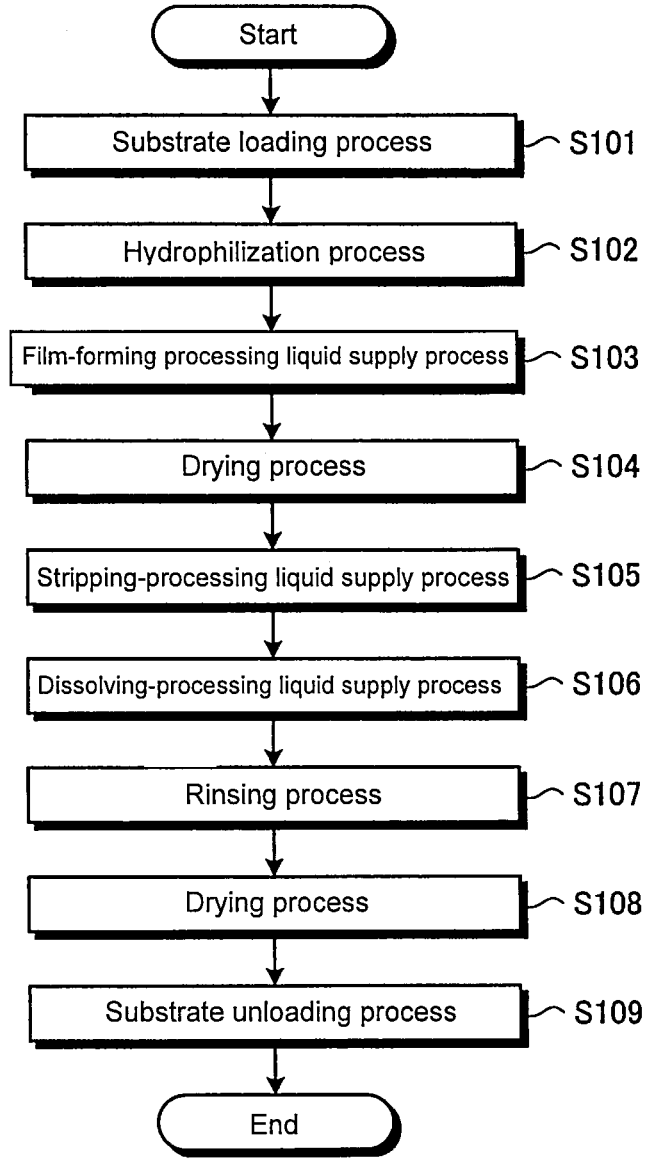
FIG. 4 is a flowchart showing procedures for a substrate cleaning processing carried out by a substrate cleaning apparatus of the first embodiment.

Detailed procedures conducted by substrate cleaning apparatus 14 are described with reference to FIG. 4. FIG. 4 is a flowchart showing procedures for a substrate cleaning processing to be conducted by substrate cleaning system 1 of the first embodiment.

As shown in FIG. 4, first, a substrate loading process is conducted in substrate cleaning apparatus 14 (step S101). In the substrate loading process, a wafer (W) loaded into chamber 20 by substrate transfer device 131 (see FIG. 2) is held by holding member 311 of substrate holding mechanism 30. At that time, the wafer (W) is held by holding member 311 in such a way that the patterned surface faces upward. Then, rotation holding section 31 is rotated by driver device 33. Accordingly, the wafer (W) also rotates with rotation holding section 31 while it is held horizontally by rotation holding section 31.

A hydrophilization process is conducted in substrate cleaning apparatus 14 (step S102). In the hydrophilization process, nozzle 41 of liquid supply device 40 is positioned above the central portion of a wafer (W). Then, ozone water as a hydrophilization treatment liquid is supplied to the patterned surface of a wafer (W) where no resist is formed. Ozone water supplied to the wafer (W) is spread on the patterned surface of the wafer (W) by centrifugal force generated by the rotation of the wafer (W). Accordingly, the patterned surface of the wafer (W) becomes hydrophilic.

When the patterned surface of a wafer (W) is already hydrophilic, the above hydrophilization treatment may be skipped.

In substrate cleaning apparatus 14, a film-forming liquid supply process is conducted (step S103). In the film-forming liquid supply process, a topcoat solution as a film-forming liquid is supplied to the patterned surface of the wafer (W) where no resist is formed. As described, the topcoat solution is supplied to the wafer (W) without a resist layer disposed between them.

The topcoat solution supplied to the wafer (W) is spread on the surface of the wafer (W) by centrifugal force generated by the rotation of the wafer (W). Then, the topcoat solution solidifies or cures while it undergoes volume contraction as its volatile component vaporizes, and a liquid film of the topcoat solution is thereby formed on the patterned surface of the wafer (W).

A topcoat solution contains acrylic resin with a property to cause volume contraction when it solidifies or cures. Thus, since volume contraction occurs not only from vaporization of the volatile component but also from curing contraction of acrylic resin, the volume contraction rate is greater than that of a film-forming liquid containing only a volatile component. Accordingly, particles (P) are removed by stronger force. Especially, since acrylic resin has a greater volume contraction rate than other resins such as epoxy resins, the topcoat solution is effective in providing tensile force to particles (P).

Before supplying a topcoat solution to a wafer (W), substrate cleaning apparatus 14 may also supply a solvent such as MIBC (4-methyl-2-pentanol) that has affinity with the topcoat solution. By so doing, wettability is enhanced on the patterned surface of a wafer (W), and it is even easier to spread a topcoat solution on the patterned surface of the wafer (W). Thus, the feed amount of a topcoat solution decreases and the processing duration is shortened.

Next, a drying process is conducted in substrate cleaning apparatus 14 (step S104). In the drying process, the topcoat solution is dried, for example, by increasing the rotation rate of the wafer (W) for a certain duration. Accordingly, vaporization of the volatile component in the topcoat solution is accelerated so that the topcoat solution solidifies or cures to form a topcoat film on the patterned surface of the wafer (W).

As for the drying process in step (S104), it is an option to decompress the inside of chamber 20 by using a vacuum device (not shown), or to lower the humidity in chamber 20 by using a downflow gas supplied from FFU 21. Using such procedures, vaporization of the volatile component is also accelerated.

The example above shows how to accelerate vaporization of the volatile component. However, a wafer (W) may be held in substrate cleaning apparatus 14 until the topcoat solution naturally solidifies or cures. Alternatively, vaporization of the volatile component may be accelerated by stopping the rotation of a wafer (W), or by rotating a wafer (W) at a rotation rate that will not cause the topcoat solution to spin off and expose the surface of the wafer (W).

A stripping-processing liquid supply process is conducted in substrate cleaning apparatus 14 (step S105). In the stripping-processing liquid supply process, DIW as a stripping-processing liquid is supplied to the topcoat film formed on the wafer (W). DIW supplied to the topcoat film is spread over the topcoat film by centrifugal force generated by the rotation of the wafer (W).

DIW infiltrates the topcoat film and reaches the interface of the wafer (W). Then, DIW infiltrates the interface (patterned surface) of the wafer (W), which is set to be hydrophilic through the hydrophilization treatment conducted in step (S102), and strips the topcoat film from the wafer (W). Accordingly, particles (P) attached to the patterned surface are stripped from the wafer (W) along with the topcoat film.

A dissolving-processing liquid supply process is conducted in substrate cleaning apparatus 14 (step S106). In the dissolving-processing liquid supply process, an alkali developing solution as a dissolving-processing liquid is supplied to the topcoat film stripped from the wafer (W). Accordingly, the topcoat film is dissolved.

When an alkali developing solution is used as a dissolving-processing liquid, zeta potential of the same polarity is generated on a wafer (W) and particles (P). Accordingly, the wafer (W) and particles (P) repel each other, preventing particles (P) from reattaching to the wafer (W).

A rinsing process is conducted in substrate cleaning apparatus 14 (step S107). In the rinsing process, DIW is supplied to the rotating wafer (W) so that the dissolved topcoat film and particles (P) floating in the alkali developing solution are removed from the wafer (W) when rinsed with DIW.

A drying process is conducted in substrate cleaning apparatus 14 (step S108). In the drying process, the wafer (W) is dried when the rotation rate of the wafer (W) is increased for certain duration to cause the DIW remaining on the surface of the wafer (W) to spin off. Then, the rotation of the wafer (W) is turned off.

A substrate unloading process is conducted in substrate cleaning apparatus 14 (step S109). In the substrate unloading process, the wafer (W) is unloaded by substrate transfer device 131 (see FIG. 2) from chamber 20 of substrate cleaning apparatus 14. Then, the wafer (W) goes through delivery device 122 and substrate transfer device 121 to be finally accommodated in carrier (C) positioned in carrier mounting section 11. When such a substrate unloading process is finished, substrate cleaning processing on a wafer (W) is completed.

Comparison with Cleaning Method Using Physical Force

Figure 5A:
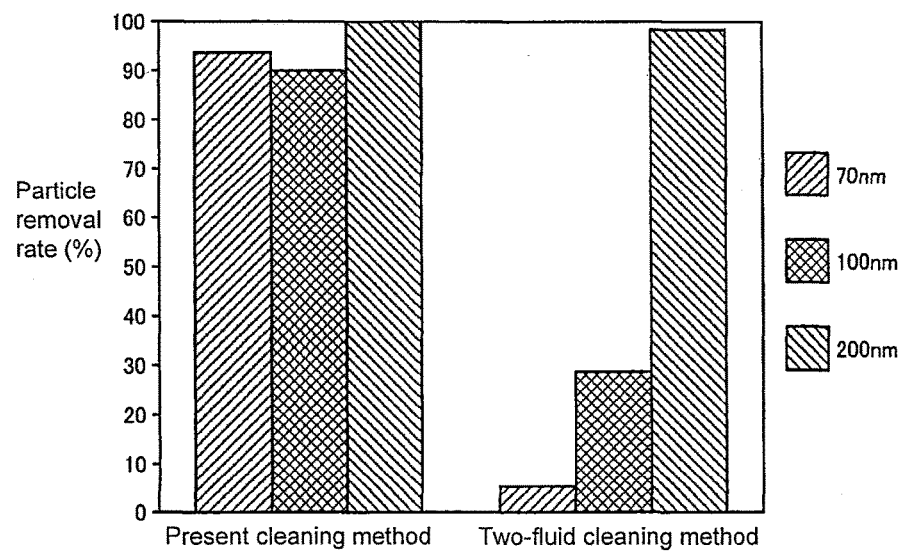
FIG. 5A is a graph showing the results of comparing a cleaning method of the embodiment and two-fluid cleaning.
Figure 5B:
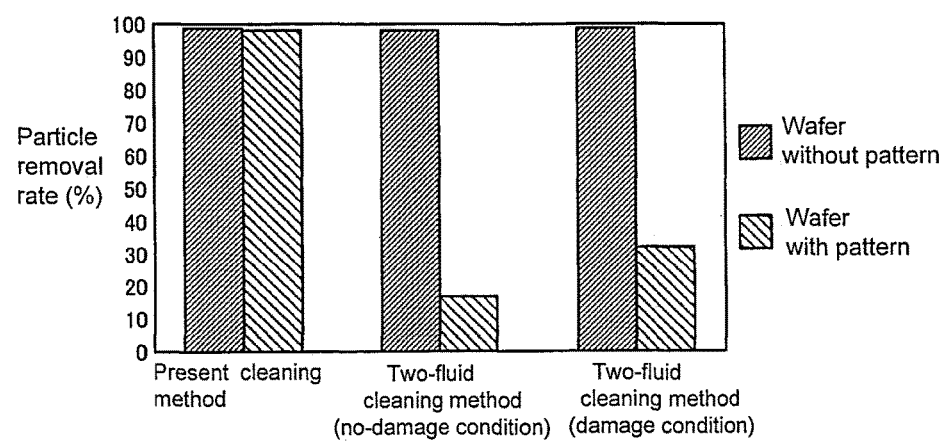
FIG. 5B is a graph showing the results of comparing a cleaning method of the embodiment and two-fluid cleaning.

In the following, a two-fluid cleaning method using physical force and a substrate cleaning method according to the first embodiment (hereinafter referred to as a "present cleaning method") are compared and the results are described by referring to FIGS. 5A and 5B. FIGS. 5A and 5B are graphs showing the results of comparing the present cleaning method and two-fluid cleaning.

$SiO_2$ particles with different particle diameters are attached to bare silicon wafers respectively and the wafers are cleaned. FIG. 5A shows comparison results of particle removal rates by each cleaning method.

FIG. 5B shows results of particle removal rates when a two-fluid cleaning method and the present cleaning method are conducted respectively on wafers where 0.5 μm-high and 0.5 μm-wide patterns are formed at 1.0 μm intervals.

The capability of removing particles (P) having a smaller particle diameter is described with reference to FIG. 5A. In FIG. 5A, the results of particle removal rates when particles (P) have a particle diameter of 70 nm are shown by diagonal hatching lines downward to the left, the results when the diameter is 100 nm are shown with cross hatching, and the results when the diameter is 200 nm are shown with diagonal hatching lines downward to the right.

As shown in FIG. 5A, when a two-fluid cleaning method was used, the particle removal rate was almost 100% when the particle diameter of particles (P) was 200 nm. However, the removal rates showed a significant decrease as the particle diameter was reduced; for example, the rates were approximately 30% when the diameter was 100 nm and approximately 5% when the diameter was 70 nm. From the results, removing particles (P) with a smaller particle diameter is found to be difficult when using a two-fluid cleaning method.

By contrast, regardless of the particle diameters of particles (P), high particle removal rates of approximately 90~100% were observed when the present cleaning method was used. Accordingly, it is found that the present cleaning method is capable of removing particles (P) having a smaller particle diameter, which are hard to remove using a two-fluid cleaning method.

The capability of removing particles (P) located among patterns is described by referring to FIG. 5B. Using particles (P) having a particle diameter of 200 nm, FIG. 5B shows the results of removal rates by each cleaning method under "no damage conditions" and "damage conditions."

"No damage conditions" indicate that a 2 nm-thick thermal oxidation layer is formed on a wafer and 100 nm-high and 45 nm-wide poly-Si patterns are formed on the thermal oxidation layer, and then cleaning is conducted using a predetermined level of force that will not cause collapse of the poly-Si patterns. "Damage conditions" indicate cleaning is conducted using a predetermined level of force that will cause pattern collapse of the above sample patterns.

In FIG. 5B, the removal rates of particles from wafers without patterns are shown by diagonal hatching lines downward to the left, whereas the removal rates of particles from wafers with patterns are shown by diagonal hatching lines downward to the right. Regarding the present cleaning method, since no collapse of sample patterns occurred, only the results under "no damage conditions" are shown.

As shown in FIG. 5B, when wafers without patterns are cleaned by the present cleaning method, two-fluid cleaning (no damage conditions) and two-fluid cleaning (damage conditions), particle removal rates were each almost 100%. No significant difference was observed between the cleaning methods.

On the other hand, compared with the results on wafers without patterns, a significant decrease in removal rates was observed when a two-fluid cleaning method was used on wafers having patterns; for example, particle removal rates were approximately 17% under no damage conditions and approximately 32% under damage conditions. As found, since removal rates of particles from wafers having patterns significantly decreased compared with the removal rates from wafers without patterns, it is found that particles (P) located among patterns are less likely to be removed by two-fluid cleaning.

By contrast, even when a wafer had patterns, the present cleaning method showed the same removal rate of almost 100% as that shown when a wafer had no patterns. Since hardly any difference was observed in particle removal rates between a wafer with patterns and a wafer without patterns, it is found that particles (P) located among patterns were appropriately removed by the present cleaning method.

Compared with two-fluid cleaning, patterns are less likely to collapse while particles (P) located among patterns are appropriately removed according to the present cleaning method.

Comparison with Cleaning Method Using Chemical Reactions

Figure 6A:
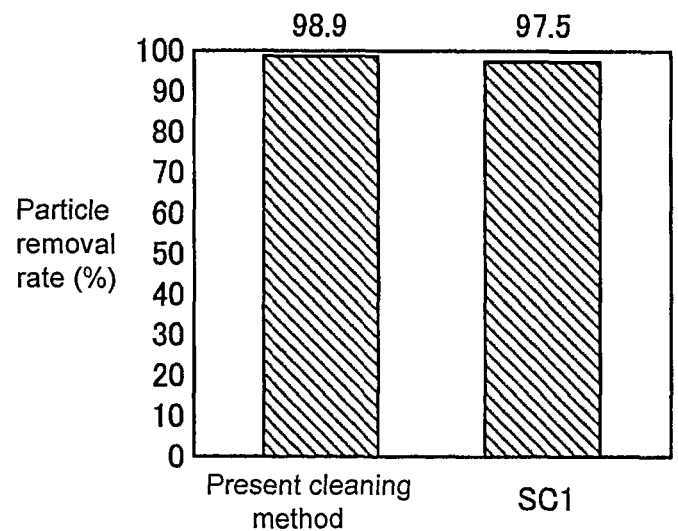
FIG. 6A is a graph showing the results of comparing a cleaning method of the embodiment and chemical cleaning.
Figure 6B:
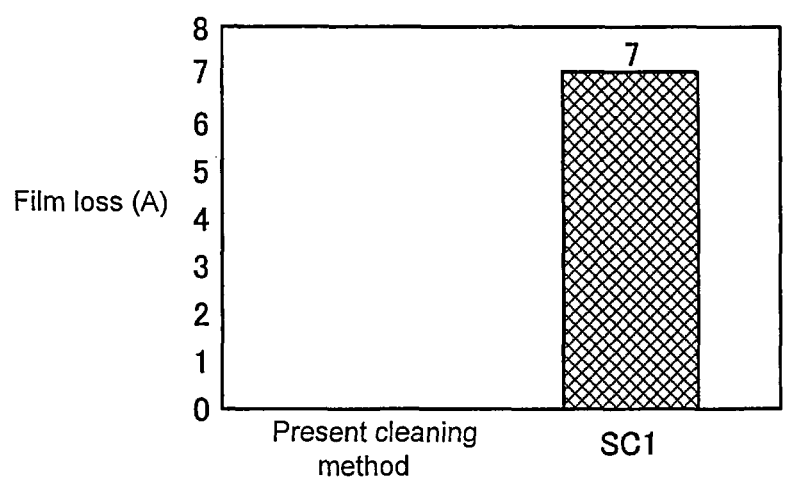
FIG. 6B is a graph showing the results of comparing a cleaning method of the embodiment and chemical cleaning.

Chemical cleaning by SC1 (a mixture of ammonia and hydrogen peroxide) as a cleaning method using chemical reactions is described by comparison with the present cleaning method. FIGS. 6A and 6B are graphs showing the results of comparing the present cleaning method and chemical cleaning. FIG. 6A shows the comparison results of particle removal rates and FIG. 6B shows the comparison results of film loss. Film loss indicates the erosion depth of the thermal oxidation layer which is the base layer formed on a wafer.

For chemical cleaning, SC1 prepared by mixing aqueous ammonia, hydrogen peroxide and water at a ratio of 1:2:40 was used to conduct cleaning under conditions of temperature at 60° C. and feeding time of 600 seconds. On a wafer, 0.5 µm-high and 0.5 µm-wide patterns were formed at 1.0 µm intervals. The particle diameter of particles (P) was 200 nm.

As shown in FIG. 6A, the particle removal rate by chemical cleaning was 97.5%, which was slightly lower than the particle removal rate (98.9%) by the present cleaning method, but it was found that particles (P) located among patterns were observed to be appropriately removed, unlike the results when the above-described two-fluid cleaning method was employed.

On the other hand, as shown in FIG. 6B, film loss of 7 Å (Angstrom) was observed as a result of chemical cleaning, while no film loss was observed as a result of the present cleaning method. Therefore, it is found that the present cleaning method is capable of removing particles (P) located among patterns without causing erosion of the base layer.

As described so far, compared with cleaning using physical force or cleaning through chemical reactions, the present cleaning method is even more effective, since it is capable of appropriately removing particles (P) with a smaller particle diameter and particles (P) located among patterns while preventing pattern collapse or erosion of the base layer.

Substrate cleaning system 1 of the first embodiment has a film-forming liquid supply device (liquid supply device 40), a stripping-processing liquid supply device (liquid supply device 40), and a dissolving-processing liquid supply device (liquid supply device 40). To a wafer with a hydrophilic surface, the film-forming liquid supply device supplies a film-forming liquid (topcoat solution) which contains a volatile component and forms a film on a wafer (W). To the film-forming liquid (topcoat film) that solidified or cured on the wafer (W) when its volatile component was vaporized, the stripping-processing liquid supply device supplies a stripping-processing liquid (DIW) to strip the film-forming liquid (topcoat film) from the wafer (W). Then, to the solidified or cured film-forming liquid (topcoat film), the dissolving-processing liquid supply device supplies a dissolving-processing liquid (alkali developing solution) to dissolve the film-forming liquid (topcoat film).

According to substrate cleaning system 1 of the first embodiment, particles (P) with a smaller particle diameter attached to a wafer (W) are removed while erosion of the base layer is suppressed.

Second Embodiment

In the above-described first embodiment, pure water was used as a stripping-processing liquid. However, a stripping-processing liquid is not limited to pure water. For example, an alkali developing solution with a concentration lower than that of the alkali developing solution as a dissolving-processing liquid may also be used as a stripping-processing liquid.

Figure 7:
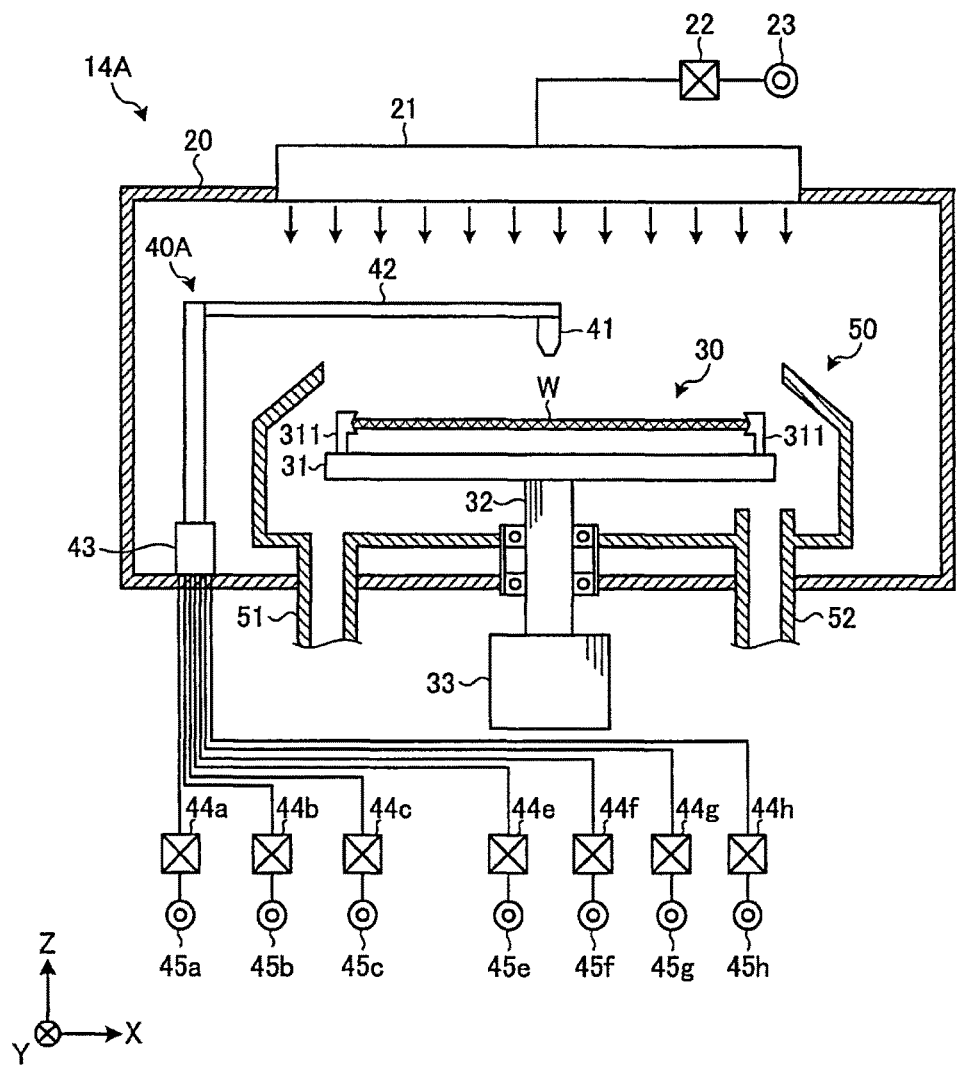
FIG. 7 is a view schematically showing the structure of a substrate cleaning apparatus according to a second embodiment.

FIG. 7 is a view schematically showing the structure of a substrate cleaning apparatus according to a second embodiment. In the following, a portion corresponding or identical to that already described above is assigned with the same reference numeral as above, and its redundant description is omitted here.

As shown in FIG. 7, in substrate cleaning apparatus (14A) of the second embodiment, liquid supply device (40A) is connected to first alkali developing solution supply source (45e), second alkali developing solution supply source (450, third alkali developing solution supply source (45g) and fourth alkali developing solution supply source (45h) respectively via valves (44e~44h).

First alkali developing solution supply source (45e) supplies an alkali developing solution with a first concentration (0.1%, for example) to liquid supply device (40A), and second alkali developing solution supply source (450 supplies an alkali developing solution with a second concentration (0.5%, for example) to liquid supply device (40A). In addition, third alkali developing solution supply source (45g) supplies an alkali developing solution with a third concentration (1.0%, for example) to liquid supply device (40A), and fourth alkali developing solution supply source (45h) supplies an alkali developing solution with a fourth concentration (2.38%, for example) to liquid supply device (40A). In the present embodiment, there is one nozzle 41 in the liquid supply device. However, two or more nozzles may be provided. For example, it is an option to provide four nozzles for supplying different types of processing liquids individually. In such a structure, alkali developing solutions with different first to fourth concentrations are supplied by using one of those nozzles and by switching valves (44e-44h).

Figure 8:
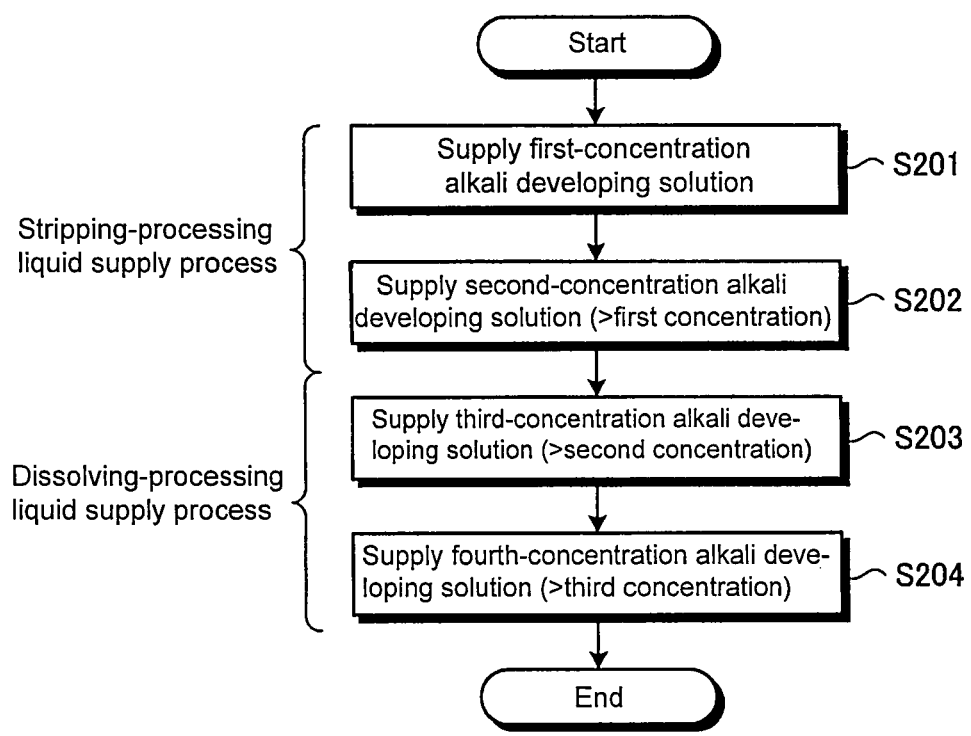
FIG. 8 is a flowchart showing procedures for a substrate cleaning processing carried out by a substrate cleaning apparatus of the second embodiment.

Specific procedures conducted in substrate cleaning apparatus (14A) of the second embodiment are described by referring to FIG. 8. FIG. 8 is a flowchart showing the procedures for substrate cleaning processing performed by substrate cleaning apparatus (14A) of the second embodiment. FIG. 8 shows only a stripping-processing liquid supply process and a dissolving-processing liquid supply process. Since other procedures are the same as those in the first embodiment carried out by substrate cleaning apparatus 14, their descriptions are omitted here.

As shown in FIG. 8, in substrate cleaning apparatus (14A), a first-concentration alkali developing solution fed from first alkali developing solution supply source (45e) is supplied as a stripping-processing liquid from liquid supply device (40A) to a wafer (W) (step S201). Since the first-concentration alkali developing solution has a low concentration, the topcoat film is stripped from a wafer (W) with hardly any topcoat film being dissolved. Thus, the same as DIW used as a stripping-processing liquid, particles (P) are stripped from the wafer (W) along with the topcoat film.

In substrate cleaning apparatus (14A), a second-concentration alkali developing solution (>first concentration) fed from second alkali developing solution supply source (45f) is supplied as a stripping-processing liquid from liquid supply device (40A) to the wafer (W) (step S202). Since the second-concentration alkali developing solution has a higher concentration than that of the first-concentration alkali developing solution, the topcoat film is further stripped from the wafer (W) while being slightly dissolved.

In substrate cleaning apparatus (14A), a third-concentration alkali developing solution (>second concentration) fed from third alkali developing solution supply source (45g) is supplied as a dissolving-processing liquid from liquid supply device (40A) to the wafer (W) (step S203). Since the third-concentration alkali developing solution has a further higher concentration than that of the second-concentration alkali developing solution, the topcoat film stripped from the wafer (W) is dissolved at a higher dissolution level than by the second-concentration alkali developing solution.

Moreover, in substrate cleaning apparatus (14A), a fourth-concentration alkali developing solution (>third concentration) fed from fourth alkali developing solution supply source (45h) is supplied as a dissolving-processing liquid from liquid supply device (40A) to the wafer (W) (step S204). Since the fourth-concentration alkali developing solution has a further higher concentration than that of the third-concentration alkali developing solution, the topcoat film is further dissolved at a higher dissolution level than by the third-concentration alkali developing solution.

As described above, an alkali developing solution with a concentration lower than that of the alkali developing solution used in a dissolving-processing liquid supply process may be supplied to the topcoat film as a stripping-processing liquid. In such a case as well, the topcoat film is stripped from a wafer (W) the same as in the process where DIW is used as a stripping-processing liquid.

In substrate cleaning apparatus (14A) of the second embodiment, concentrations of alkali developing solutions used in a stripping-processing liquid supply process were changed from a lower concentration to a higher concentration within a range that does not exceed the concentration of an alkali developing solution used in the dissolving-processing liquid supply process. By so setting, since the topcoat film also dissolves while it is being stripped, the duration for substrate cleaning is shortened.

In substrate cleaning apparatus (14A) of the second embodiment, concentrations of alkali developing solutions used in a dissolving-processing liquid supply process were changed from a lower concentration to a higher concentration. By so setting, compared with a case when a high-concentration alkali developing solution as a dissolving-processing liquid is supplied without a preliminary step, the topcoat film is prevented from remaining on the wafer (W).

In the above stripping-processing liquid supply process, a first-concentration alkali developing solution was supplied first on the topcoat film. However, DIW may be supplied prior to the supply of the first-concentration alkali developing solution.

In the above stripping-processing liquid supply process and dissolving-processing liquid supply process, supply of alkali developing solutions was conducted in two steps. However, in a stripping-processing liquid supply process and a dissolving-processing liquid supply process, supply of alkali developing solutions may be conducted in three or more steps. Alternatively, supply of alkali developing solutions in either a stripping-processing liquid supply process or a dissolving-processing liquid supply process may be conducted in a single step.

In the above, liquid supply device (40A) is connected to multiple supply sources (first alkali developing solution supply source (45e)~fourth alkali developing solution supply source (45h)), which supply alkali developing solutions of various different concentrations. However, it is an option for liquid supply device (40A) to be structured so as to be connected only to fourth alkali developing solution supply source (45h), which supplies a fourth-concentration alkali developing solution.

In such a structure, by supplying simultaneously from nozzle 41 both DIW and a fourth-concentration alkali developing solution, substrate cleaning apparatus (14A) can supply to a wafer (W) an alkali developing solution with a concentration lower than that of the fourth-concentration alkali developing solution. Substrate cleaning apparatus (14A) can supply first- to fourth-concentration alkali developing solutions to a wafer (W) by adjusting the feed amount of DIW.

In the above, alkali developing solutions with different concentrations are used as a stripping-processing liquid and dissolving-processing liquid. However, IPA solutions (mixed solution of IPA and pure water) with different concentrations may also be used. In such a case, low-concentration IPA solutions for a stripping-processing liquid supply process and high-concentration IPA solutions for a dissolving-processing liquid supply process are supplied in steps.

Third Embodiment

Figure 9:
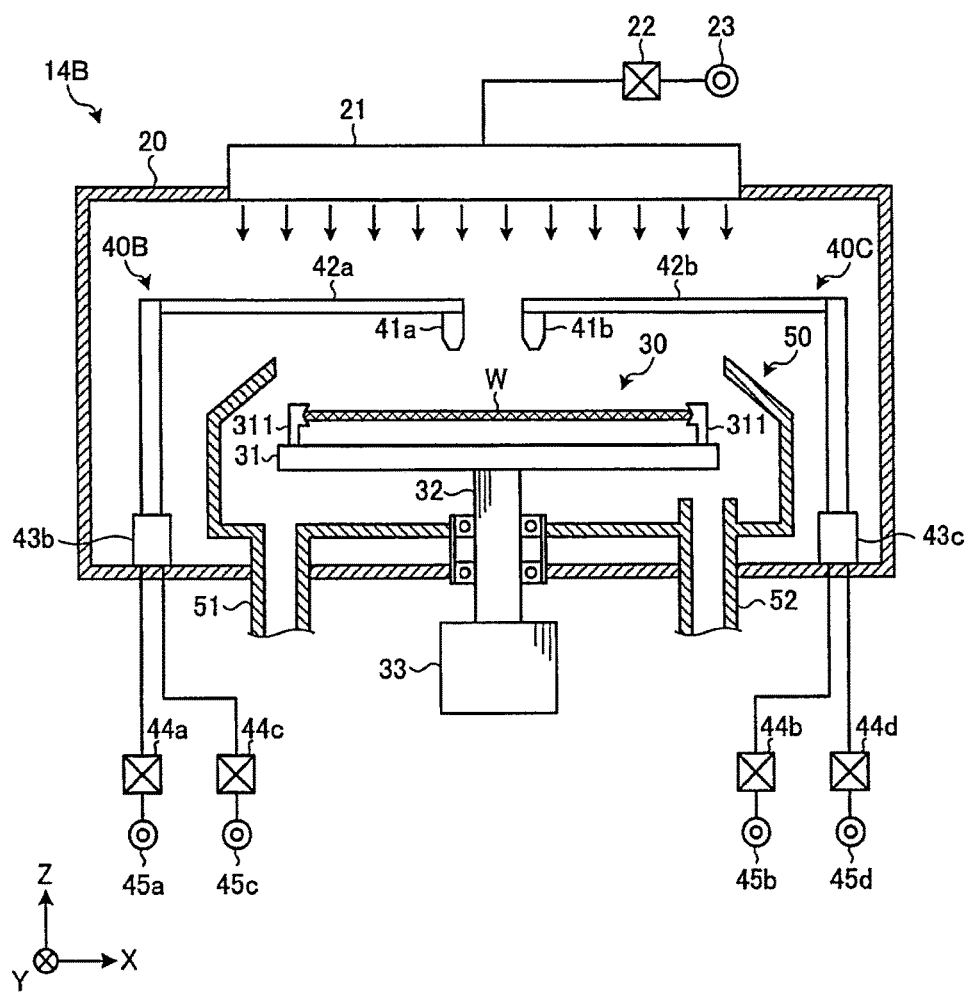
FIG. 9 is a view schematically showing the structure of a substrate cleaning apparatus according to a third embodiment.

In the above embodiments, multiple processing liquids such as a topcoat solution and an alkali developing solution are supplied from nozzle 41 provided on one arm. However, a substrate cleaning apparatus may have nozzles provided on multiple arms. In the following, an example in which a substrate cleaning apparatus having nozzles provided on multiple arms is described with reference to FIG. 9. FIG. 9 is a view schematically showing the structure of a substrate cleaning apparatus according to a third embodiment.

As shown in FIG. 9, substrate cleaning apparatus (14B) according to the third embodiment has first liquid supply device (40B) and second liquid supply device (40C).

First liquid supply device (40B) has nozzle (41a), arm (42a) to horizontally support nozzle (41a), and rotatable elevator mechanism (43b) to rotate, elevate and lower arm (42a). Also, second liquid supply device (40C) has nozzle (41b), arm (42b) to horizontally support nozzle (41b) and rotatable elevator mechanism (43c) to rotate, elevate and lower arm (42b).

Nozzle (41a) of first liquid supply device (40B) is connected to ozone water supply source (45a) and DIW supply source (45c) via valves (44a, 44c) respectively. Nozzle (41b) of second liquid supply device (40C) is connected to topcoat solution supply source (45b) and alkali developing solution supply source (45d) via valves (44b, 44d) respectively.

As described, substrate cleaning apparatus (14B) may also supply ozone water, topcoat solution, DIW and alkali developing solutions by allocating them to nozzles (41a, 41b) of multiple arms.

To change concentrations of alkali developing solutions as in substrate cleaning apparatus (14A) of the second embodiment, DIW is supplied from nozzle (41a) of first liquid supply device (40B) while an alkali developing solution is supplied from nozzle (41b) of second liquid supply device (40C). In such a case, an alkali developing solution and DIW are mixed on a wafer (W) so as to form a low-concentration alkali developing solution on the wafer (W).

In the above, substrate cleaning apparatus (14B) is set to have two liquid supply devices (first liquid supply device (40B) and second liquid supply device (40C)). However, multiple nozzles may be provided for one liquid supply device.

Fourth Embodiment

Figure 10:
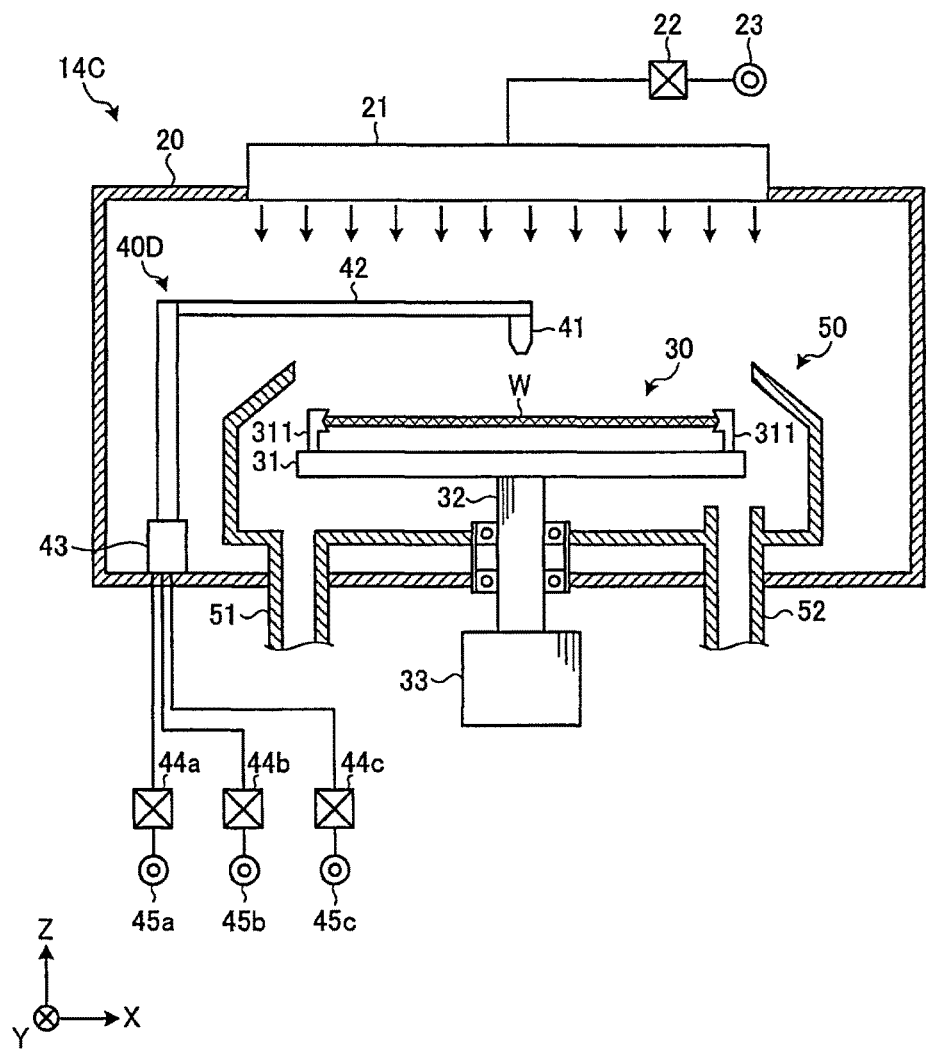
FIG. 10 is a view schematically showing the structure of a substrate cleaning apparatus according to a fourth embodiment.

In each embodiment described above, by conducting the dissolving-processing liquid supply process after the stripping-processing liquid supply process, the topcoat film stripped from a wafer (W) was dissolved. However, a dissolving-processing liquid supply process is not always necessary to conduct. In the following, such an example is described with reference to FIG. 10. FIG. 10 is a view schematically showing the structure of a substrate cleaning apparatus according to a fourth embodiment.

As shown in FIG. 10, substrate cleaning apparatus (14C) of the fourth embodiment has liquid supply device (40D). Nozzle 41 of liquid supply device (40D) is connected to ozone water supply source (45a), topcoat solution supply source (45b) and DIW supply source (45c) via valves (44a~44c) respectively.

Figure 11:
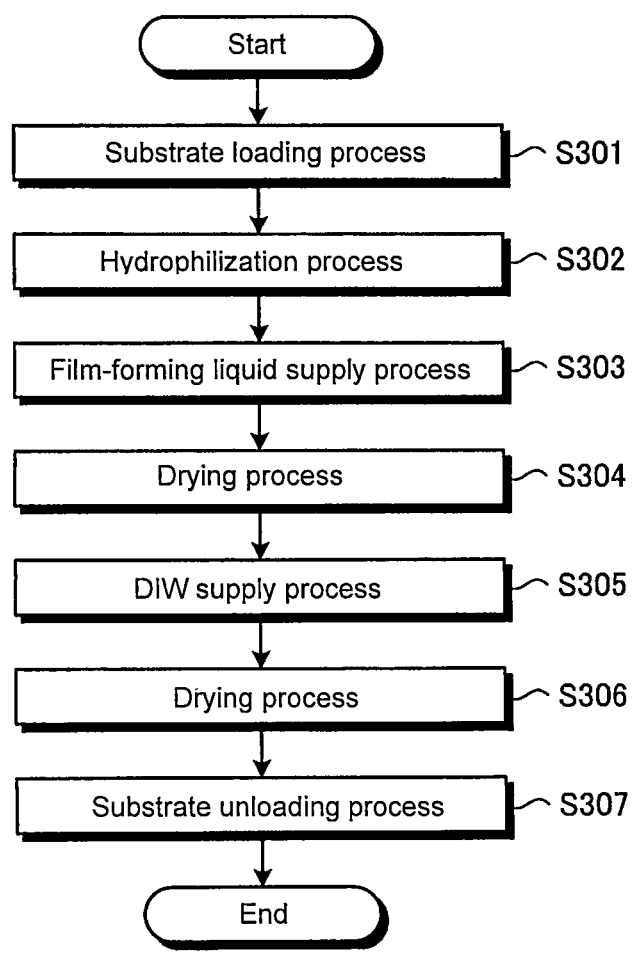
FIG. 11 is a flowchart showing procedures for a substrate cleaning processing carried out by the substrate cleaning apparatus of the fourth embodiment.

Procedures for substrate cleaning processing conducted by substrate cleaning apparatus (14C) of the fourth embodiment are described with reference to FIG. 11. FIG. 11 is a flowchart showing the procedures for substrate cleaning processing to be conducted by substrate cleaning apparatus (14C) of the fourth embodiment. Since procedures conducted in steps (S301~S304) shown in FIG. 11 are the same as those in steps (S101~S104) (see FIG. 4) described in the first embodiment, their descriptions are omitted here.

As shown in FIG. 11, after a drying process (step S304) has been conducted, a DIW supply process (step S305) is carried out in substrate cleaning apparatus (14C). In such a DIW supply process, DIW as a stripping-processing liquid is supplied to the topcoat film formed on the wafer (W). DIW supplied to the topcoat film is spread over the topcoat film by centrifugal force generated by the rotation of the wafer (W).

As described, DIW as a stripping-processing liquid infiltrates the topcoat film, and reaches the interface of a wafer (W). Then, DIW infiltrates the interface of the wafer (W) which is made hydrophilic so that the topcoat film is stripped from the wafer (W). Accordingly, particles (P) attached to the wafer (W) are stripped from the wafer (W) along with the topcoat film. Then, by keeping the supply of DIW, particles (P) are removed from the wafer (W) along with the stripped topcoat film. Accordingly, substrate cleaning apparatus (14C) of the fourth embodiment is capable of conducting a stripping-processing liquid supply process and a rinsing process continuously, without the switching or the like of processing liquids.

Next, the same as steps (S108, S109) shown in FIG. 4, a drying process (step S306) and a substrate unloading process (step S307) are performed, and the substrate cleaning processing is finished.

As described above, when the cleaning target is a bare wafer without patterns, from which particles (P) are relatively easy to remove, it is an option to finish substrate cleaning processing without conducting a dissolving-processing liquid supply process after a stripping-processing liquid supply process has been conducted.

Other Embodiments

In the above-described first through third embodiments, a film-forming liquid supply process and a dissolving-processing liquid supply process were conducted in the same chamber. However, a film-forming liquid supply process and a dissolving-processing liquid supply process may be conducted in separate chambers. In such a setting, for example, it is an option to position in processing station 3 shown in FIG. 2 both a first substrate cleaning apparatus to conduct step (S101) (substrate loading process) through step (S104) (drying process) shown in FIG. 4 and a second substrate cleaning apparatus to conduct step (S105) (stripping-processing liquid supply process) through step (S109) (substrate unloading process) shown in FIG. 4. Alternatively, a stripping-processing liquid supply process and a dissolving-processing liquid supply process may be conducted in separate chambers.

In each of the above-described embodiments, liquid DIW was used as a stripping-processing liquid. However, mist DIW may be used as a stripping-processing liquid.

In each embodiment described above, DIW was directly supplied to a topcoat film by using a nozzle. However, DIW may be indirectly supplied to a topcoat film by increasing the humidity in a chamber using a humidifier or the like.

In each embodiment described above, DIW, which is pure water at normal temperature, was used as a stripping-processing liquid. However, heated pure water may be used as a stripping-processing liquid.

In each embodiment described above, a topcoat solution was used as a film-forming liquid and DIW or a low-concentration alkali developing solution was used as a stripping-processing liquid. However, a film-forming liquid and a stripping-processing liquid are not limited to any specific combination as long as a combination of liquids allows a stripping process without causing a processing film formed on a wafer (W) to dissolve (or before the film dissolves). For example, it is sufficient if a stripping-processing liquid contains at least one of the following: CO2 water (DIW with CO2 gas mixed in), acidic or alkaline solution, solution with a surfactant, fluorine-based solvent such as hydrofluoroether (HFE), and diluted IPA (isopropyl alcohol (IPA) diluted by pure water).

When a topcoat solution is used as a film-forming liquid, a substrate cleaning apparatus may supply to a wafer a solvent having affinity with a topcoat solution, for example, MIBC (4-methyl-2-pentanol), prior to conducting a film-forming liquid supply process. MIBC is contained in a topcoat solution and has affinity with the topcoat solution. As a solvent having affinity with a topcoat solution, for example, PGME (propylene glycol monomethyl ether), PGMEA (propylene glycol monomethyl ether acetate) or the like may be used instead of MIBC.

By coating MIBC, which has affinity with a topcoat solution, on a wafer (W) in advance, the topcoat solution tends to spread well over the upper surface of the wafer (W) and infiltrate spaces among patterns in a later film-forming liquid supply process. Thus, the feed amount of a topcoat solution is reduced and particles (P) located among patterns are more certainly removed. Also, the duration for a film-forming liquid supply process is shortened.

In each embodiment described above, an alkali developing solution was used in a dissolving-processing liquid supply process. However, a dissolving-processing liquid may be prepared by adding hydrogen peroxide to an alkali developing solution. By adding hydrogen peroxide to an alkali developing solution, surface roughness of the wafer surface caused by an alkali developing solution is suppressed.

A dissolving-processing liquid may be an organic solvent such as MIBC (4-methyl-2-pentanol), thinners, toluene, acetates, alcohols, glycols (propylene glycol monomethyl ether) or the like, or an acidic developing solution based on acetic acid, formic acid, hydroxyacetic acid or the like.

Moreover, a dissolving-processing liquid may contain a surfactant. Since a surfactant weakens surface tension, it is capable of suppressing particles (P) from reattaching to a wafer (W) or the like.

Unwanted substances as targets to be removed are not limited to particles; for example, they may be other substances such as a polymer remaining on a substrate after dry etching or ashing.

By employing a method using physical force, it is difficult to remove unwanted substances such as particles with a smaller diameter or a polymer.

By employing a method to remove particles using chemical reactions of a chemical solution, the base layer of a substrate may be eroded by etching or the like, for example.

However, by employing a substrate cleaning method, a substrate cleaning system and a memory medium according to embodiments of the present invention, smaller-diameter unwanted substances attached to a substrate are removed while erosion of the base layer is suppressed.

A substrate cleaning method according to an embodiment of the present invention includes a film-forming liquid supply process and a stripping-processing liquid supply process. In the film-forming liquid supply process, to a substrate with a hydrophilic surface, a film-forming liquid containing a volatile component is supplied for forming a film on the substrate. In the stripping-processing liquid supply process, to a processing film formed by the film-forming liquid that is solidified or cured on the substrate when the volatile component is vaporized, a stripping-processing liquid is supplied so that the processing film is stripped from the substrate.

According to an embodiment of the present invention, smaller-diameter unwanted substances attached to a substrate are removed while erosion of the base layer is suppressed.

Obviously, numerous modifications and variations of the present invention are possible in light of the above teachings. It is therefore to be understood that within the scope of the appended claims, the invention may be practiced otherwise than as specifically described herein.

What is claimed is:

1. A method for cleaning a substrate, comprising:
supplying to a substrate having a hydrophilic surface a film-forming processing liquid which includes a volatile component;
vaporizing the volatile component in the film-forming processing liquid such that the film-forming processing liquid solidifies or cure on the substrate and forms on the hydrophilic surface of the substrate a processing film that captures and contains particles on the hydrophilic surface of the substrate;
supplying to the substrate having the processing film a strip-processing liquid which strips the processing film containing the particles from the hydrophilic surface of the substrate, wherein the strip-processing liquid separates the processing film from the hydrophilic surface by infiltrating between the processing film and the hydrophilic surface; and
when the processing film is separated from the hydrophilic surface and located above the hydrophilic surface, supplying to the processing film a dissolving-processing liquid which dissolves the processing film stripped by the strip-processing liquid such that the dissolving-processing liquid dissolves the processing film stripped by the strip-processing liquid, wherein the substrate is one of a silicon wafer and a compound semiconductor wafer and wherein the film-forming processing liquid is a topcoat solution comprising resin and the volatile component, wherein the dissolving-processing liquid is selected from the group consisting of an alkali developing solution having a first alkali concentration that dissolves the processing film into a liquid state, an isopropyl alcohol (IPA) and water solution having a first IPA concentration that dissolves the processing film into a liquid state, 4-methyl-2-pentanol, toluene, a glycol, an acetic acid solution, a formic acid solution, and a hydroxyacetic acid solution, and wherein the strip-processing liquid is selected from the group consisting of pure water, an alkali developing solution having a second alkali concentration that is lower than the first alkali concentration, an IPA and water solution having a second IPA concentration that is lower than the first IPA concentration, and water mixed with $CO_2$ gas.

2. The method for cleaning a substrate according to claim 1, wherein the strip-processing liquid is pure water.

3. The method for cleaning a substrate according to claim 1, further comprising:
applying hydrophilic treatment to a surface of the substrate such that the hydrophilic surface of the substrate is formed prior to the supplying of the film-forming processing liquid.

4. The method for cleaning a substrate according to claim 1, wherein the supplying of the film-forming processing liquid comprises supplying the film forming processing liquid to the substrate without a resist layer on the substrate.

5. The method for cleaning a substrate according to claim 1, wherein the hydrophilic surface of the substrate has a pattern formed on the hydrophilic surface of the substrate, and the supplying of the film-forming processing liquid comprises supplying the film-forming processing liquid to the hydrophilic surface having the pattern.

6. The method for cleaning a substrate according to claim 2, further comprising:
applying hydrophilic treatment to a surface of the substrate such that the hydrophilic surface of the substrate is formed prior to the supplying of the film-forming processing liquid.

7. The method for cleaning a substrate according to claim 2, wherein the supplying of the film-forming processing liquid comprises supplying the film-forming processing liquid to the substrate without a resist layer on the substrate.

8. The method for cleaning a substrate according to claim 2, wherein the hydrophilic surface of the substrate has a pattern formed on the hydrophilic surface of the substrate, and the supplying of the film-forming processing liquid comprises supplying the film-forming processing liquid to the hydrophilic surface having the pattern.

9. The method for cleaning a substrate according to claim 1, further comprising:
applying hydrophilic treatment to a surface of the substrate such that the hydrophilic surface of the substrate is formed prior to the supplying of the film-forming processing liquid,
wherein the hydrophilic treatment comprises treating the surface of the substrate with ozone water.

10. The method for cleaning a substrate according to claim 1,
wherein the dissolving-processing liquid is an alkali developing solution having a concentration of 1.0% or higher.

11. The method for cleaning a substrate according to claim 1, further comprising:
supplying a rinsing-treatment liquid after the processing film is dissolved by the dissolving-processing liquid such that the rinsing-treatment liquid rinses off the particles and the dissolving-processing liquid from the substrate.

12. The method for cleaning a substrate according to claim 1, wherein the strip-processing liquid is the diluted isopropyl alcohol, and the dissolving-processing liquid is a second isopropyl alcohol solution having a concentration that is higher than a concentration of the diluted isopropyl alcohol.

13. The method for cleaning a substrate according to claim 1, wherein the strip-processing liquid is an alkali developing solution having a concentration of 0.5% or less, and the dissolving-processing liquid is an alkali developing solution having a concentration of 1.0% or higher.

14. The method for cleaning a substrate according to claim 1, wherein the resin in the topcoat solution comprises acrylic resin.

15. The method for cleaning a substrate according to claim 1, wherein the particles have particle diameters of 100 nm or less, and the hydrophilic surface is a patterned surface.

* * * * *